United States Patent
Kasten

(10) Patent No.: US 6,727,699 B2
(45) Date of Patent: Apr. 27, 2004

(54) SUPERCONDUCTING MAGNET SYSTEM

(75) Inventor: Arne Kasten, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 20 days.

(21) Appl. No.: 10/050,996

(22) Filed: Jan. 22, 2002

(65) Prior Publication Data

US 2002/0101240 A1 Aug. 1, 2002

(30) Foreign Application Priority Data

Feb. 1, 2001 (DE) .......................... 101 04 365

(51) Int. Cl.[7] ................................. G01V 3/00
(52) U.S. Cl. ........................... 324/318; 324/320
(58) Field of Search ..................... 324/318, 320; 335/216, 299; 128/653.1

(56) References Cited

U.S. PATENT DOCUMENTS

| | | | | |
|---|---|---|---|---|
| 4,788,502 A | | 11/1988 | Keller .................. | 324/318 |
| 4,812,797 A | * | 3/1989 | Jayakumar ............ | 335/299 |
| 4,974,113 A | | 11/1990 | Gabrielse ............. | 324/318 |
| 5,278,502 A | | 1/1994 | Laskaris ............... | 324/318 |
| 5,437,276 A | * | 8/1995 | Takada ................. | 128/653.1 |
| 5,739,689 A | * | 4/1998 | Roth et al. ............ | 324/320 |

FOREIGN PATENT DOCUMENTS

| | | |
|---|---|---|
| EP | 0 406 862 | 1/1991 |
| EP | 0 562 708 | 9/1993 |
| GB | 2 285 313 | 7/1995 |
| GB | 2 308 644 | 7/1997 |

OTHER PUBLICATIONS

V.V. Sukhoi et al. "Superconducting Compensator for Magnetic Field Instabilities in Persistent Superconducting Solenoids". Voprosy Atomnol Nauki i Techniki, Seria Obshchaya i Yadernaya Fizika 1981, vol. 3(17) 1–81.

* cited by examiner

Primary Examiner—Brij B. Shrivastav
(74) Attorney, Agent, or Firm—Paul Vincent

(57) ABSTRACT

The invention concerns a means and a method for stabilizing a magnetic field generated by a superconductingly short-circuited main coil located in a cryostat in the measuring volume of a high-resolution magnetic resonance spectrometer, which comprises compensation coils which are dimensioned and positioned such that they, in their entirety, are suited to largely compensate for field drifts of the superconductingly short-circuited main coil in the measuring volume. The drift compensation coils consist of HTS material and are disposed radially outside of the main coil at a higher temperature level.

30 Claims, 3 Drawing Sheets

SUPERCONDUCTING MAGNET SYSTEM

This application claims Paris Convention priority of DE 101 04 365.1 filed Feb. 1, 2001 the complete disclosure of which is hereby incorporated by reference.

BACKGROUND OF THE INVENTION

The invention concerns a superconducting magnet system, in particular for a high-resolution magnetic resonance spectrometer, comprising a substantially cylindrical cryostat with an axial room temperature bore for receiving a sample, a radio frequency transmitting and detecting system, and a main coil which is superconductingly short-circuited during operation and is located in a first, radially inner region within the cryostat at a first low temperature level, and surrounds the sample in the room temperature bore and generates, during operation, a homogeneous temporally stable magnetic field at the sample location which satisfies the requirements for recording a high-resolution magnetic resonance spectrum.

Means for stabilizing the magnetic field generated by a superconductingly short-circuited main coil located in a cryostat in the measuring volume of a high-resolution magnetic resonance spectrometer, in particular a high-resolution NMR spectrometer, are known from superconducting magnet systems of NMR spectrometers built by the assignee, wherein the means comprise one or more compensation coils which are dimensioned and located such that, in their entirety, they are suitable for largely compensating field drifts of the superconductingly short-circuited main coil in the measuring volume.

In addition to an extremely good magnetic field homogeneity over the sample volume, high-resolution NMR spectrometers must also have a likewise good temporal stability for the magnetic field. Towards this end, the superconducting main coil of the magnet is superconductingly short-circuited during operation. The requirements for the properties of the superconducting short-circuit switch, the quality of the superconducting coil wires, and for the superconducting joints between the individual wire sections of the coil are therefore stringent. Overall decay times for the superconducting coil current of tens of thousands of years must be guaranteed during short-circuit operation.

Temporal fluctuations of the magnetic field at the sample location can be compensated for by a so-called lock system. Towards this end, the spectrometer measures a separate NMR signal of a lock substance (i.a. deuterium) usually within an associated frequency band and its frequency is stabilized via a feedback circuit by means of a small resistive compensation coil (lock coil) in the room temperature bore of the magnet system.

A superconductingly short-circuited magnet coil keeps the magnetic flux through its bore constant, i.e. the superconducting current changes spontaneously e.g. in response to an external disturbance field such that the total flux through the coil does not change. This usually causes the field in the working volume to become inhomogeneous and to change since the spatial distribution of a disturbance field and that of the main magnet coil are different. Compensation for these deviations through the geometrical design of the main coil, using additional superconducting coils or active control measures has been proposed (V. V. Sukhol et al., Voprosy Atomnoi Nauki I Techniki, Seria Obshchaya i Yademaya Fizika 1981, Vol. 3 (17) 1–81, U.S. Pat. Nos. 4,974,113, 4,788,502, 5,278,503).

The superconducting magnets of high-resolution NMR generally use superconducting shim coil sets in a first step towards homogenizing the field at the sample location. During operation, a correction current is applied to the individual coil sets and superconductingly short-circuited. The shim coil sets can also comprise a so-called $B_0$ coil which can generate a small sufficiently homogeneous additional field at the sample location. Such a coil permits precise setting of the field, or the proton frequency, to a predetermined value without interrupting the superconducting current circuit of the main coil. Moreover, a drift in the main coil can also be compensated for, within given limits, via the short-circuited $B_0$ coil. Towards this end, the $B_0$ coil must be positioned and dimensioned such that the field decay of the main coil induces a counter current in the $B_0$ coil which causes the field at the sample location to remain constant. This method is limited in that the current through the $B_0$ coil must not exceed a certain value due to e.g. the wire used. In any case, the contribution of the (inhomogeneous) $B_0$ coil must remain sufficiently small that the field homogeneity over the sample is not impaired. Moreover, the required inductive coupling of the $B_0$ coil to the main coil during a quench can cause excessive current flow and destruction of the $B_0$ coil which requires protective counter measures and associated additional expense.

Although the production of superconducting high field magnets for high-resolution NMR spectrometers (or also ICR spectrometers) has reached a very high level of quality and reliability, some of the very expensive magnet systems nevertheless clearly exceed the specified drift limits while otherwise being quite stable. Attempted compensation of drift using the lock coil or a $B_0$ coil of the shim system would quickly lead to the above-mentioned limits and the intervals between post-regulation of the total field (including associated opening of the superconducting main current circuit, introduction of current rods, helium loss etc.) would be intolerably short.

For this reason, there is a need for a superconducting magnet system of the above-mentioned type which can compensate for drifts of a magnitude above the maximum specified limit, over long periods without inadmissibly impairing the homogeneity and stability of the magnetic field at the sample location. In particular, the use of existing drifting main coils should be possible.

SUMMARY OF THE INVENTION

This object is achieved in that at least one superconducting drift compensation coil is located in a second radially outer region within the cryostat at a second higher temperature level within the cryostat.

A superconducting compensation coil, in particular of high-temperature superconducting material can be disposed at a temperature level above the main coil, radially outside of the main coil, in particular in a nitrogen tank of the magnetic cryostat or in thermal contact with the refrigerator stage of the cryostat in the temperature region between 20K and 100K. A compensating current flows through the compensation coil and compensates for the decay of the magnetic field due to the drift of the main coil at the sample location. Maintenance of the compensation field with sufficient homogeneity using e.g. an appropriate Helmholtz arrangement is easier at larger separations from the sample location.

The use of a superconducting wire ensures generation of a sufficiently large current. Arrangement outside of the main coil, in particular in the nitrogen tank, ensures that the superconducting main coil must not be altered and modifications of the helium tank installation are not necessary.

In a preferred embodiment, the compensation coil is connected to an external current source and the compensation current is regulated, or merely controlled, through measurement of the field at or close to the sample location. Active regulation avoids generation of an additional superconductingly short-circuited current circuit which could charge in an uncontrolled fashion. When the current source is switched off, the compensation current stops flowing. On the other hand, the use of a superconductor reduces the heat input e.g. into the nitrogen tank to a negligible level. Regulation preferably occurs through a lock circuit, optionally in addition to and as a supplement to the already existing resistive lock. A coarse compensation might be sufficient, optionally in steps of long duration. The resistive lock system thereby performs the fine adjustment. The fact that the contribution of the compensating field to the overall field is very small (up to approximately $10^{-5}$) permits toleration of inevitable noise even in the high-resolution spectrometer since it can be easily maintained below $10^{-6}$. Of course, it should be noted that inductive couplings of the compensation coil to the superconducting circuits of the main coil and to the shim system are either eliminated in the arrangement or taken into consideration in the design.

In an alternative embodiment, the compensation coil comprises a superconducting switch and is at least temporally superconductingly short-circuited during operation. Superconducting wires of HTS materiel do not currently have the low ohmic resistance required for NMR applications, in particular, for large currents. Recently, however, there has been promising progress which anticipates HTS sections becoming part of a main coil, even at full current. It seems feasible that they may soon be used in a suitable superconductingly short-circuited compensation coil of low current. But even a compensation coil with some drift can still reduce the drift of a main coil for a relatively long period of time as long as the compensation field produced by It has a smaller drift (absolute not relative!) than that of the main field. Optionally, even two or more nested compensation coils could be used, with a decay of the current in the inner coil inducing a larger compensation current In the outer coil just as a current decay of the main coil produces a current in the inner compensation coil which is larger than the current decay of the main coil. The compensation current (or currents) can be reset from time to time to their nominal value by an external regulatable or controllable power supply.

With the exception of the highest field strengths, the magnet systems of modern NMR or ICR spectrometers are usually actively shielded, i.e. the main coil consists of two partial coils which are connected in series and produce opposite fields such that the total dipole moment of the arrangement and therefore the stray field substantially vanishes. Moreover, as mentioned above, resistive and/or superconducting compensation arrangements are usually provided which minimize the influence of external disturbances at the sample location. The present invention is preferably used in combination with these measures, wherein it should always be noted that the various shielding and compensation means interact. This must either be partially eliminated (zero coupling) or the overall behavior of the apparatus must be explicitly taken into consideration in the design.

The invention is explained in more detail below with reference to the drawing.

Figure 3:
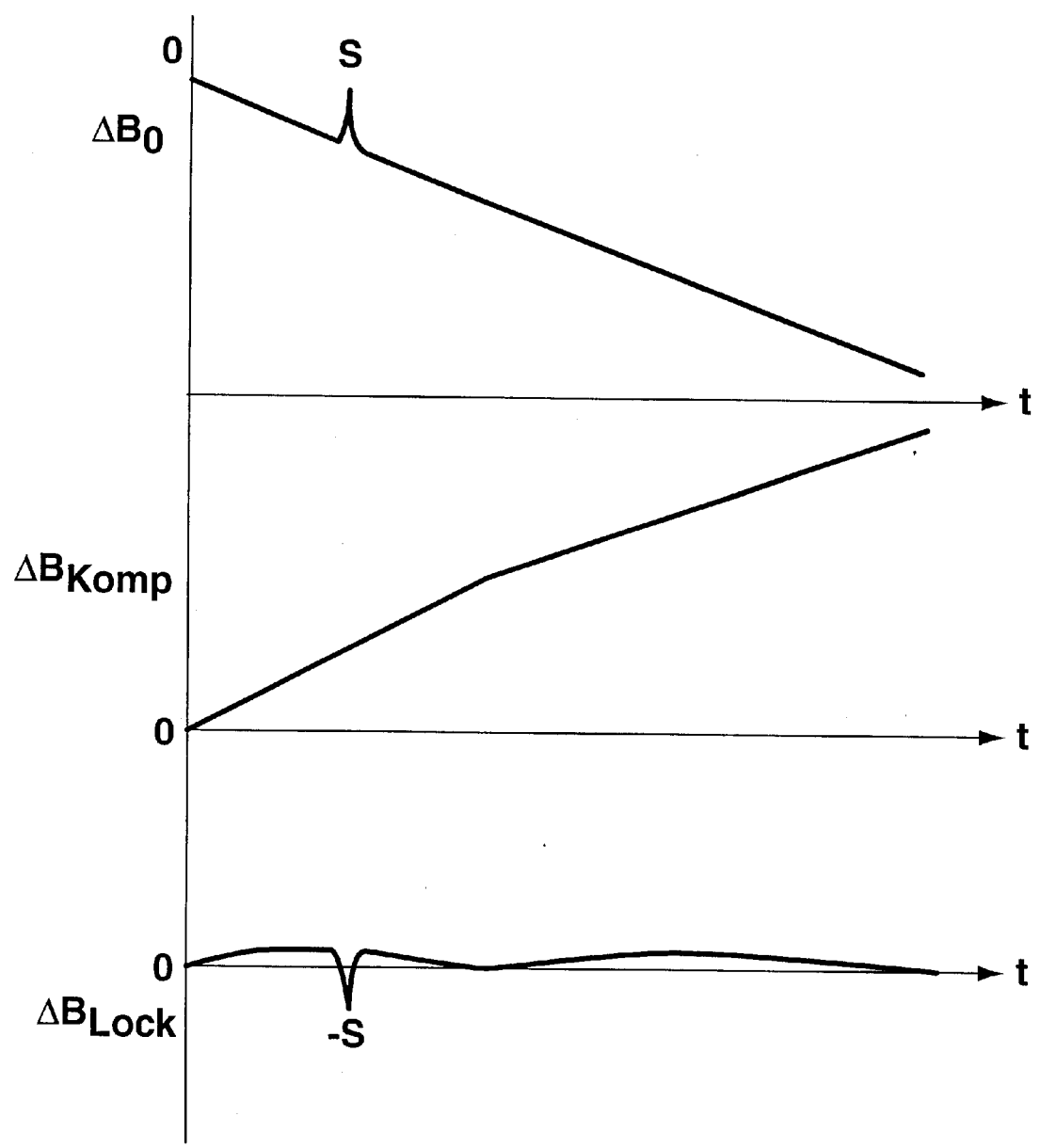

c) of the field ($\Delta B_{lock}$) generated by the fine adjustment (lock system) in case of drift compensation in steps at separated time intervals;

FIG. 3 shows the temporal development a) of the (drifting) main field magnet (($\Delta B_0$) at the sample location b) of the compensation field ($\Delta B_{comp}$) generated by the drift compensation coil(s)

c) of the field ($\Delta B_{lock}$) generated by the fine adjustment (lock system) in case of drift compensation for a linear approximation which is updated at separated time intervals.

DESCRIPTION OF THE PREFERRED EMBODIMENT

Figure 1:
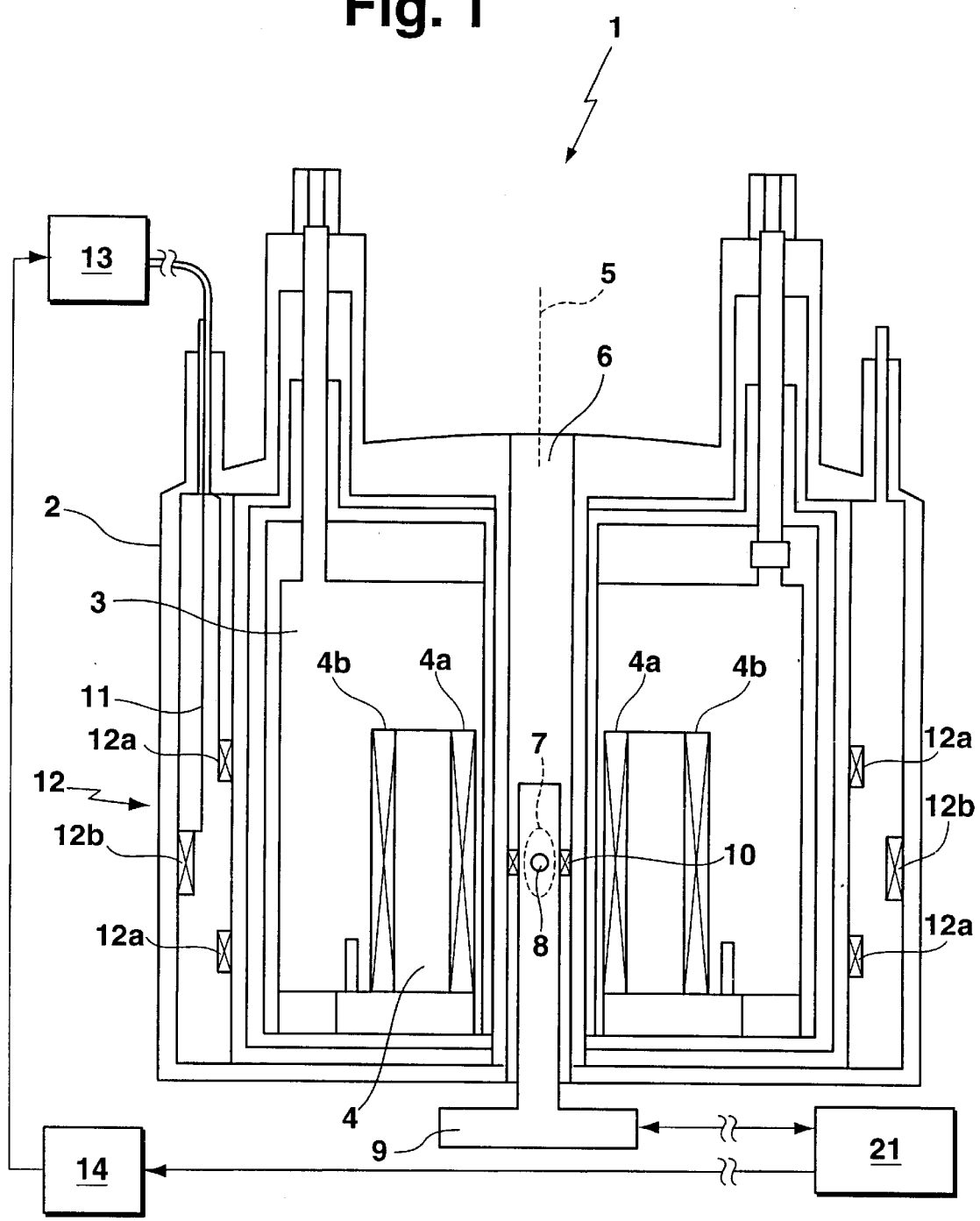
FIG. 1 is an extremely schematic representation of the cryostat of a nuclear magnetic resonance apparatus comprising a main coil in the helium tank and a stabilization means in the nitrogen tank.

FIG. 1 schematically shows a detailed section through the substantially rotationally cylindrical cryostat of the superconducting magnet system 1, e.g. of a high-resolution NMR apparatus. The main magnet coil 4 is disposed in a helium tank 3 of the cryostat 2 which is superconductingly short-circuited during operation and is actively shielded in this embodiment, i.e. consists of two opposing partial coils 41 and 4b. The cryostat 2 has a room temperature bore 6 along its cylinder axis 5 within which a sample 8 is located in the center of the main magnet coil 4 in a measuring region 7 and is surrounded by an RF transmitter and receiver coil arrangement 9 (probe head).

A so-called lock coil 10 is also located within the room temperature bore 6, optionally integrated in the probe head 9, for fine adjustment of the magnetic field in the measuring region. This lock coil 10 is uncoupled or only slightly coupled to the main magnet coil 4. The correction current through the lock coil 10 of NMR spectrometers is generally controlled by the NMR console 21 via an NMR lock signal of a lock substance added to the sample 8 such that the NMR frequency of the lock substance (e.g. deuterium) and therefore the magnetic field at the sample location remain constant. Such known lock arrangements are very precise. However, the available range is small and they are designed for the correction of fluctuations about the desired value and are not suitable for the correction of continuous field drifts.

The helium tank 3 of the cryostat 2 is surrounded by a nitrogen tank 11 containing drift compensation coils 12 which, in the present embodiment, are fed by a power supply unit 13 which is controlled by a control device 14. The drift compensation coils 12 consist of high temperature superconducting material and are superconducting at the ca. 77 K prevailing in the nitrogen tank and can carry a relatively high current without heating the nitrogen tank 11 (except for their feed lines). The drift compensation coil arrangement 12 is preferably substantially decoupled from the main coil 4 and the lock coil 9, to facilitate control. A possible drift of the main coil 4 in short-circuited operation can be compensated for by the drift compensation coil 12. It is thereby sufficient to only approximately compensate for the drift, e.g. in steps or using a linear approximation which is controlled and adjusted from time to time. The lock system performs the fine adjustment, i.e. the drift compensation must only assume that the deviation from the desired value remains sufficiently small that the maximum admissible range for the lock system is not exceeded. An indication thereof is given by the control current through the lock coil 10. If the experiment takes longer, one would initially feed a relatively large negative current through the drift compensation coil 12 which is reduced with continued drift of the main coil 4 and which finally changes sign. The maximum admissible current through the drift compensation coil 12 and the drift strength thereby define a maximum duration for an experiment with constant magnetic field. The maximum field of the drift compensation coil 12 at the sample location is orders of magnitude larger than that of the lock coil 10, however, still very small compared to that of the main coil 4 such that this compensation field can be kept sufficiently homogeneous and the noise introduced by the power supply 13 is still within acceptable limits. Mounting the compensation coil(s) 12 in the nitrogen tank 11 has the advantage that this can be done without interfering with the helium tank 3 and main coil 4. In particular, this can be effected retroactively. As mentioned before, decoupling of the coil systems concerned is recommended in this arrangement. In any case, the field of the drift compensation coil 12 should not be shielded by the superconductingly short-circuited main coil 4.

Superconducting short-circuiting of a drift compensation coil 12 is an alternative to the drift compensation coil 12 actively controlled by a power supply 13. In this case, the compensation coil 12 and main coil 4 must be inductively coupled such that when the current through the main coil 4 is reduced, the current induced in the drift compensation coil 12 causes the field at the sample location 8 to remain constant. It is also possible to provide several current circuits of drift compensation coils 12a, 12b which are either simultaneously short-circuited or e.g. with one 12b being actively operated via a power supply 13 and being switched in only after the short-circuited compensation coils 12a have reached their current limit.

Figure 2:
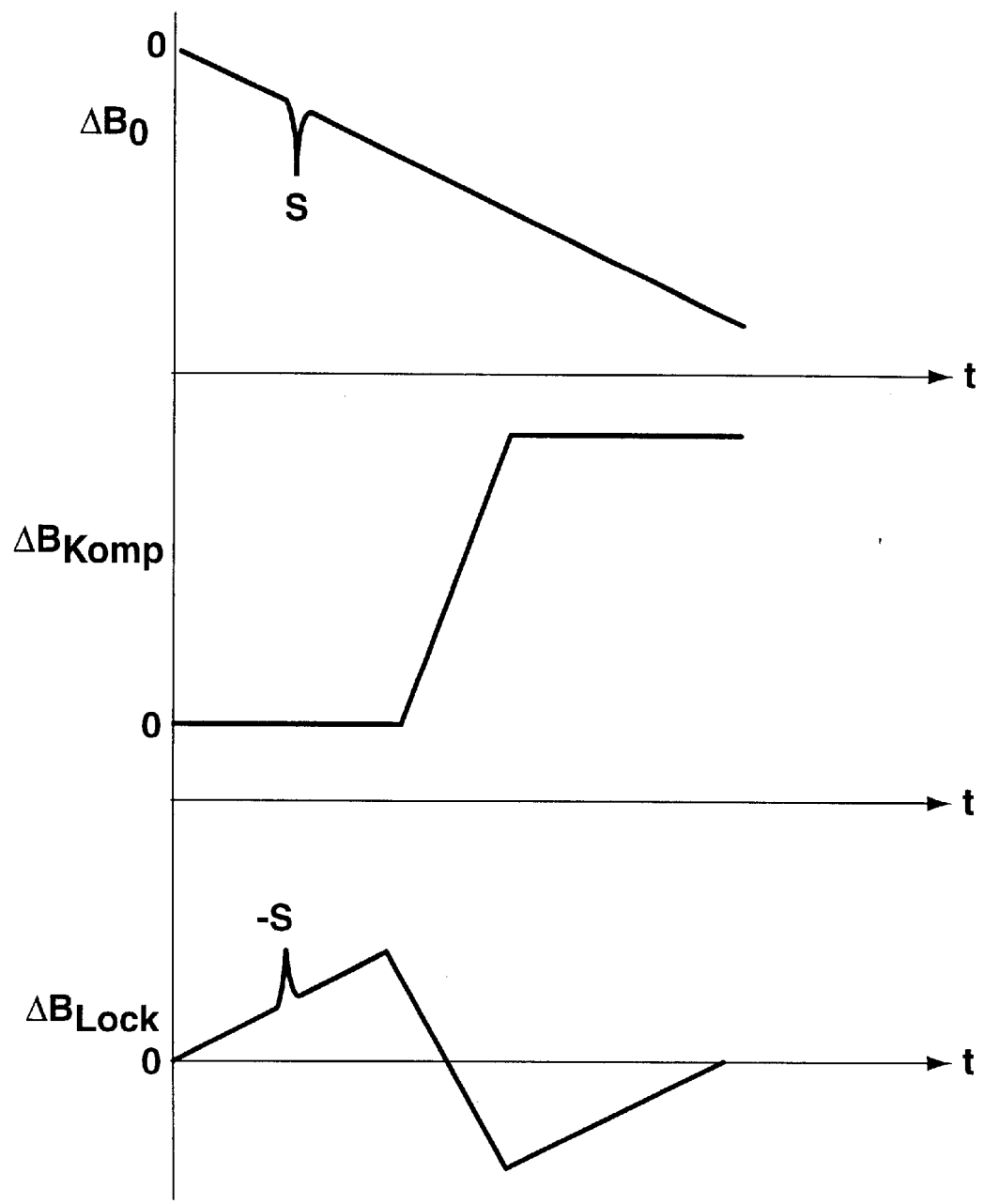
FIG. 2 shows the temporal development a) of the (drifting) main field magnet ($\Delta B_0$) at the sample location b) of the compensation field ($\Delta B_{comp}$) generated by the drift compensation coil(s)

FIG. 2 shows, for drift compensation in steps at separated time intervals, the temporal development of the (drifting) main magnetic field at the sample location, of the compensation field generated by the drift compensation coil(s) and of the field generated by fine adjustment (lock system) which sum together to produce a constant overall field at the sample location. A fluctuation S caused by an external disturbance is controlled by the lock system by means of an opposing field pulse -S.

FIG. 3 likewise shows, for drift compensation in linear approximation, the temporal development of the (drifting) main magnetic field at the sample location, of the compensation field generated by the drift compensation coil(s) and of the field generated by the fine adjustment (lock system) which combine to produce an overall constant field at the sample location with smaller loading of the lock coil.

The drift can, of course, also be compensated for using other approximations. However, a linear one is generally sufficient and subsequent corrections in the slope are only required at relatively large time intervals.

Clearly, the invention is not limited to the embodiments shown but can be used in other modifications. In particular, the invention can be advantageously combined with the plurality of known compensation measures for internal drifts and external disturbances thereby taking into consideration the coupling of the controlled, regulated or short-circuited coil circuits.

I claim:
1. A superconducting magnet system for magnetic spectroscopy of a sample, the system comprising:
   a substantially cylindrical cryostat having an axial room temperature bore for receiving the sample;
   a high frequency transmitter and detection system for exciting and detecting a signal of the sample;
   a superconducting main coil which is short-circuited during operation and which is located in a first radially inner region within said cryostat at a first low temperature, said main coil surrounding the sample in said room temperature bore and generating a homogeneous, temporally stable magnetic field at the sample location during operation which satisfies requirements for recording a high resolution magnetic resonance spectrum; and
   a superconducting drift compensation coil, said drift compensation coil disposed In a second radially outward region within said cryostat at a second higher temperature within said cryostat, said second higher temperature being greater than said first low temperature, wherein said drift compensation coil is superconductingly short-circuited during operation and said main coil and said drift compensation coil are designed such that, when said main coil drifts, said drift compensation coil recharges to keep said magnetic field at said sample sufficiently homogeneous and temporally constant.

2. The magnet system of claim 1, wherein said main coil comprises several sections connected in series which are protected, in response to uncontrolled transition into a normally conducting state, by a network of at least one of protective resistances and diodes.

3. The magnet system of claim 2, wherein, during superconductingly short-circuited operation, said main coil has a field drift between $10^{-8}$ and $10^{-5}$ of the field at said sample, per hour.

4. A high-resolution magnetic resonance spectrometer comprising the magnet system of claim 3.

5. The magnetic resonance spectrometer of claim 4, further comprising a device for precise determination of said magnetic field at said sample as well as means for controlling an instantaneous value of said magnetic field at the sample to a desired value, wherein an approximate compensation of field drift of said main coil is effected by said drift compensation coil and fine adjustment of said instantaneous value is effected by an additional lock system.

6. The magnetic resonance spectrometer of claim 5, wherein said approximate compensation is carried out in steps having at least one of a height and a temporal interval which are adjusted by occasional determination of said instantaneous value of said field at the sample.

7. The magnetic resonance spectrometer of claim 5, wherein said approximate compensation is generated by one of a temporally monotonic and a linearly varying current in said drift compensation coil having a temporal development determined and updated by intermittent determination of said instantaneous value of said field at the sample.

8. The magnet system of claim 1, wherein said drift compensation coil is made from a high-temperature superconducting material.

9. The magnet system of claim 8, wherein said drift compensation coil is disposed in a nitrogen tank of said cryostat.

10. The magnet system of claim 8, wherein said drift compensation coil is in thermal contact with a radiation shield of said cryostat.

11. A superconducting magnet system for magnetic spectroscopy of a sample, the system comprising:
a substantially cylindrical cryostat having an axial room temperature bore for receiving the sample;
a high frequency transmitter and detection system for exciting and detecting a signal of the sample;
a superconducting main coil which is short-circuited during operation and which is located in a first radially inner region within said cryostat at a first low temperature, said main coil surrounding the sample in said mom temperature bore and generating a homogeneous, temporally stable magnetic field at the sample location during operation which satisfies requirements for recording a high resolution magnetic resonance spectrum; and
a superconducting drift compensation coil, said drift compensation coil disposed in a second radially outward region within said cryostat at a second higher temperature within said cryostat, said second higher temperature being greater than said first low temperature, wherein said drift compensation coil is superconductingly short-circuited during operation and further comprising at least one further magnet coil disposed within said cryostat, wherein said main coil, said drift compensation coil and said at least one further magnet coil are designed such that, when said main coil drifts, said drift compensation coil and said at least one further magnet coil recharge to keep said magnetic field at said sample sufficiently homogeneous and temporally constant.

12. The magnet system of claim 11, wherein said main coil comprises several sections connected in series which are protected, in response to uncontrolled transition into a normally conducting state, by a network of at least one of protective resistances and diodes.

13. The magnet system of claim 12, wherein, during superconductingly short-circuited operation, said main coil has a field drift between $10^{-8}$ and $10^{-5}$ of the field at said sample, per hour.

14. A high-resolution magnetic resonance spectrometer comprising the magnet system of claim 13.

15. The magnetic resonance spectrometer of claim 14, further comprising a device for precise determination of said magnetic field at said sample as well as means for controlling an instantaneous value of said magnetic field at the sample to a desired value, wherein an approximate compensation of field drift of said main coil is effected by said drift compensation coil and fine adjustment of said instantaneous value is effected by an additional lock system.

16. The magnetic resonance spectrometer of claim 15, wherein said approximate compensation is carried out in steps having at least one of a height and a temporal interval which are adjusted by occasional determination of said instantaneous value of said field at the sample.

17. The magnetic resonance spectrometer of claim 15, wherein said approximate compensation is generated by one of a temporally monotonic and a linearly varying current in said drift compensation coil having a temporal development determined and updated by intermittent determination of said instantaneous value of said field at the sample.

18. The magnet system of claim 11, wherein said drift compensation coil is made from a high-temperature superconducting material.

19. The magnet system of claim 18, wherein said drift compensation coil is disposed in a nitrogen tank of said cryostat.

20. The magnet system of claim 18, wherein said drift compensation coil is in thermal contact with a radiation shield of said cryostat.

21. A superconducting magnet system for magnetic spectroscopy of a sample, the system comprising:
a substantially cylindrical cryostat having an axial room temperature bore for receiving the sample;
a high frequency transmitter and detection system for exciting and detecting a signal of the sample;
a superconducting main coil which is short-circuited during operation and which is located in a first radially inner region within said cryostat at a first law temperature, said main coil surrounding the sample in said room temperature bore and generating a homogeneous, temporally stable magnetic field at the sample location during operation which satisfies requirements for recording a high resolution magnetic resonance spectrum; and
a superconducting drift compensation coil, said drift compensation coil disposed in a second radially outward region within said cryostat at a second higher temperature within said cryostat, said second higher temperature being greater than said first low temperature, wherein, during operation, said drift coil is driven by an external regulatable or controllable power supply.

22. The magnet system of claim 21, wherein said main coil comprises several sections connected in series which are protected, in response to uncontrolled transition into a normally conducting state, by a network of at least one of protective resistances and diodes.

23. The magnet system of claim 22, wherein, during superconductingly short-circuited operation, said main coil has a field drift between $10^{-8}$ and $10^{-5}$ of the field at said sample, per hour.

24. A high-resolution magnetic resonance spectrometer comprising the magnet system of claim 23.

25. The magnetic resonance spectrometer of claim 24, further comprising a device for precise determination of said magnetic field at said sample as well as means for controlling an instantaneous value of said magnetic field at the sample to a desired value, wherein an approximate compensation of field drift of said main coil is effected by said drift compensation coil and fine adjustment of said instantaneous value is effected by an additional lock system.

26. The magnetic resonance spectrometer of claim 25, wherein said approximate compensation is carried out in steps having at least one of a height and a temporal interval which are adjusted by occasional determination of said instantaneous value of said field at the sample.

27. The magnetic resonance spectrometer of claim 25, wherein said approximate compensation is generated by one of a temporally monotonic and a linearly varying current in said drift compensation coil having a temporal development determined and updated by intermittent determination of said instantaneous value of said field at the sample.

28. The magnet system of claim 21, wherein said drift compensation coil is made from a high-temperature superconducting material.

29. The magnet system of claim 28, wherein said drift compensation coil is disposed in a nitrogen tank of said cryostat.

30. The magnet system of claim 28, wherein said drift compensation coil is in thermal contact with a radiation shield of said cryostat.

* * * * *